United States Patent [19]
Morita

[11] Patent Number: 5,250,814
[45] Date of Patent: Oct. 5, 1993

[54] SEMICONDUCTOR LIGHT-EMITTING DEVICES

[75] Inventor: Yoshio Morita, Osaka, Japan

[73] Assignee: Matsushita Electric Industrial Co., Ltd., Japan

[21] Appl. No.: 894,320

[22] Filed: Jun. 4, 1992

[30] Foreign Application Priority Data

Jun. 5, 1991 [JP] Japan .................. 3-133961

[51] Int. Cl.$^5$ .................. H01L 33/00
[52] U.S. Cl. .................. 257/13; 257/94; 257/96; 257/103; 257/97; 372/43; 372/45
[58] Field of Search .................. 257/13, 94, 96, 103, 257/97; 372/43, 45

[56] References Cited

U.S. PATENT DOCUMENTS

| 5,008,891 | 4/1991 | Morita | .................. 372/45 |
| 5,091,758 | 2/1992 | Morita | .................. 257/103 |

FOREIGN PATENT DOCUMENTS

| 60-173893 | 9/1985 | Japan | .................. 372/43 |
| 1-318273 | 12/1989 | Japan | .................. 372/45 |
| 2-20086 | 1/1990 | Japan | .................. 372/45 |
| 2-194564 | 8/1990 | Japan | .................. 257/103 |

OTHER PUBLICATIONS

"Preparation and Properties of Green-Light-Emitting CdS-CuGaS$_2$ Heterodiodes" by Sigurd Wagner; Journal of Applied Physics, vol. 45, No. 1, Jan. 1974; pp. 246-251.

"Green Electroluminescence from ZnS-CuGaS$_2$ Heterojunction Diode in DC Operation", Satoshi Kobayashi et al.; Japanese Journal of Applied Physics; vol. 30, No. 10A; Oct., 1991, pp. L1747-L1749.

*Primary Examiner*—William Mintel
*Assistant Examiner*—Minhloan Tran
*Attorney, Agent, or Firm*—Lowe, Price, LeBlanc & Becker

[57] ABSTRACT

A semiconductor light-emitting device, such as LEDs AND laser diodes having emission wavelengths in a range which includes the blue to ultra-violet region of the spectrum are disclosed. The LED comprises a substrate and an p-n junction structure formed on the substrate, the p-n junction structure having first and second semiconductor layers, each consisting essentially of $(Cu_aAg_{1-a})(Al_bGa_{1-b})(Se_oS_{1-o})_2$, wherein $0 \leq a \leq 1$, $0 \leq b \leq 1$, and $0 \leq c \leq 1$, the first semiconductor layer being doped with N, P, or As, the second semiconductor layer being doped with Zn, Cd, Cl, Br, or I. A semiconductor laser comprises a substrate and a double-hetero structure formed on the substrate, the double-hetero structure having: a p-type semiconductor layer, an active layer formed on the p-type semiconductor layer, and n-type semiconductor layer formed on the active layer, each of the p-type semiconductor layer and n-type semiconductor layer consisting essentially of $(Cu_aAg_{1-a})(Al_bGa_{1-b})(Se_oS_{1-o})_2$, wherein $0 \leq a \leq 1$, $0 \leq b \leq 1$, and $0 \leq c \leq 1$, the active layer consisting essentially of $(Zn_dCd_{1-d})(Se_mS_nTe_{1-m-n})$, wherein $0 \leq d \leq 1$, $0 \leq m \leq 1$, $0 \leq n \leq 1$, and $m+n \leq 1$.

19 Claims, 2 Drawing Sheets

SEMICONDUCTOR LIGHT-EMITTING DEVICES

BACKGROUND OF THE INVENTION

1. Field of the Invention

This invention relates to semiconductor light-emitting devices such as semiconductor lasers, light-emitting diodes, etc. and in particular relates to semiconductor light-emitting devices having emission wavelengths in a range which includes the blue to ultra-violet region of the spectrum.

2. Description of the Prior Art

In recent years semiconductor lasers have been realized in practice, which utilize AlGaAs/GaAs III-V semiconductor materials. When a semiconductor laser is used in a data processing application such as data readout from an optical disc, or in a laser printer, it is desirable that the emission wavelength of the light produced from the semiconductor laser should be as short as possible, in order to maximize the data processing performance. However with semiconductor lasers that have been utilized hitherto, even if the activation layer of the laser is formed of a material such as AlGaInP, which has a large size of forbidden energy gap and is among the direct-transition type III-V semiconductor materials, it is only possible to achieve an emission wavelength that is in the range 580 to 690 nm. Thus, the emission wavelength cannot be made sufficiently short to reach the blue region of the visible spectrum. Another direct-transition type compound semiconductor material which has an even larger value of forbidden energy gap is Zn(SSe), which is a II-VI compound semiconductor. There is a possibility to achieve a semiconductor laser having a shorter wavelength of the emission light with the double-heterostructure. However, due to the difficulty encountered in controlling p-type conduction in this material, it has not been possible to utilize it practically to obtain emission in the blue to ultra-violet region of the spectrum up to the present.

On the other hand, the possibility of production of pn junction type light-emitting devices is known which is obtained by combining n-type II-VI compound semiconductor and p-type chalcopyrite type compound semiconductor. Sigurd Wagner; Journal of Applied Physics, Vol. 45, No. 1, January (1974) p246 and Satoshi Kobayashi et al.; Japanese Journal of Applied Physics, Vol. 30 NO. 10A, October (1991), pp. L1747, describe methods of production of hetero-junction diodes by combining II-VI compound semiconductor and chalcopyrite type compound semiconductor which are materials having a large size of forbidden energy gap. The former reported that a green light emission was obtained with combination of CdS-CuGaS$_2$. The latter reports a green light emission with combination of ZnS-CuGaS$_2$.

As mentioned above, there is a need for a capability for practical manufacture of semiconductor light-emission devices having wavelengths in a range which includes the blue to ultra-violet region of the spectrum. The inventor studied a lot of combinations of II-VI compound semiconductor and chalcopyrite type compound semiconductor. As result, the inventor found a new combination of II-VI compound semiconductors and chalcopyrite type compound semiconductors for providing wavelengths in a range which includes the blue to ultra-violet region of the spectrum.

SUMMARY OF THE INVENTION

The present invention has been developed in order to remove the above-described drawbacks inherent to the conventional semiconductor light-emitting device.

According to the present invention there is an LED (light-emitting diode) or a semiconductor laser as a semiconductor light-emitting device having emission wavelengths in a range which includes the blue to ultra-violet region of the spectrum.

According to the present invention there is provided an LED as the semiconductor light-emitting device comprises a substrate and an p-n junction structure formed on the substrate, the p-n junction structure having first and second chalcopyrite type semiconductor layers having a large size of forbidden energy gap, each consisting essentially of $(Cu_aAg_{1-a})(Al_bGa_{1-b})(Se_oS_{1-o})_2$, wherein $0 \leq a \leq 1$, $0 \leq b \leq 1$, and $0 \leq c \leq 1$, the first semiconductor layer being doped with N, P, or As, the second semiconductor layer being doped with Zn, Cd, Cl, Br, or I. This LED having emission wavelengths in a range from 330 to 730 nm.

According to the present invention there is also provided a semiconductor laser comprises a substrate and a double-heterostructure formed on the substrate, the double-heterostructure having: a p-type semiconductor layer, an active layer comprising a semiconductor II-VI layer formed on the p-type semiconductor layer, and n-type semiconductor layer formed on the active layer, each of the p-type semiconductor layer and n-type semiconductor layer consisting essentially of $(Cu_aAg_{1-a})(Al_bGa_{1-b})(Se_oS_{1-o})_2$, wherein $0 \leq a \leq 1$, $0 \leq b \leq 1$, and $0 \leq c \leq 1$, the active layer consisting essentially of $(Zn_dCd_{1-d})(Se_mS_nTe_{1-m-n})$, wherein $0 \leq d \leq 1$, $0 \leq m \leq 1$, $0 \leq n \leq 1$, and $m+n \leq 1$. This semiconductor laser having emission wavelengths in a range from 380 to 690 nm.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Figure 1:
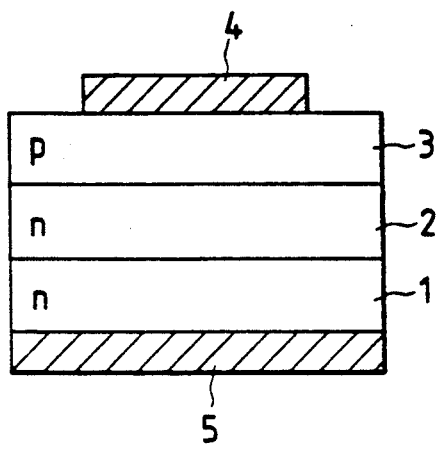
FIG. 1 is a cross-sectional view of the first embodiment of the present invention.

Hereinbelow will be described a first embodiment of this invention. FIG. 1 is a cross-sectional view of the first embodiment of the present invention, which is an light-emitting diode (LED) as a semiconductor light-emitting device. In FIG. 1, numeral 1 denotes a substrate which is formed of n-type GaAs. On the substrate 1, an n-type $(Cu_{0.89}Ag_{0.11})AlSe_2$ layer 2, which is a chalcopyrite semiconductor, having a substantially identical value of lattice constant to that of GaAs, that is, 5.653A is formed (lattice matching) by epitaxial growth. On the n-type $(Cu_{0.89}Ag_{0.11})AlSe_2$ layer 2, p-type $(Cu_{0.89}Ag_{0.11})AlSe_2$ layer 3, which is a chalcopyrite semiconductor, also having a substantially identical value of lattice constant to that of GaAs, that is, 5.653A is formed by epitaxial growth. On the p-type $(Cu_{0.89}Ag_{0.11})AlSe_2$ layer 3, an In-Ga electrode 4 is formed on the p-type $(Cu_{0.89}Ag_{0.11})AlSe_2$ layer 3 as a p-type electrode on the opposite side of the n-type $(Cu_{0.89}Ag_{0.11})AlSe_2$ layer 2. On the substrate 1, an Au-Ge electrode 5 is formed on the opposite side of the n-type $(Cu_{0.89}Ag_{0.11})AlSe_2$ layer 2. Forbidden energy gap of these n-type and p-type layers are approximately 2.76 eV.

This LED is formed by the MBE (molecular beam epitaxy) method. That is, the n-type GaAs substrate 1 is heated to about 400° C. Then, the n-type $(Cu_{0.89}Ag_{0.11})AlSe_2$ layer 2 is formed by epitaxial growth to have a thickness of about 1 μm in the condition that a flux ratio of Se/Al is 2 and that of Cu/Al is 1, using Cu, Ag, Al, and Se as source materials. During this processing, Zn is doped into the $(Cu_{0.89}Ag_{0.11})AlSe_2$ layer 2 at $10^{18}/cm^3$ to have n-type characteristic. Then, in the same growth condition, the $(Cu_{0.89}Ag_{0.11})AlSe_2$ layer 3 is formed by epitaxial growth to have a thickness of about 1 μm using Cu, Ag, Al, and Se as source materials. During this processing, As is doped into the $(Cu_{0.89}Ag_{0.11})AlSe_2$ layer 3 to form a p-type film having a carrier density up to $10^{18}/cm^3$.

It has been found that when a current is passed through this LED having the above configuration to estimate a current to voltage characteristic, this LED emits blue light of 100 mcd stable at wavelength of 450 nm when the forward current is 20 mA.

Figure 2:
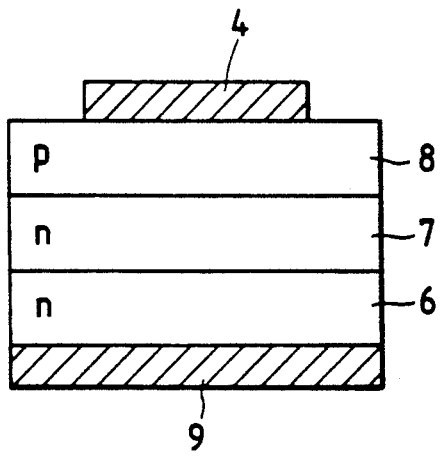
FIG. 2 is a cross-sectional view of the second embodiment of the present invention.

Hereinbelow will be described a second embodiment of this invention. FIG. 2 is a cross-sectional view of the second embodiment of the present invention, which is a light emitting diode (LED) as a semiconductor light-emitting device. In FIG. 2, numeral 6 denotes a substrate which is formed of n-type GaP. On the substrate 6, an n-type $Cu(Al_{0.60}Ga_{0.40})(Se_{0.46}S_{0.54})$ layer 7, which is a chalcopyrite semiconductor, having a substantially identical value of lattice constant to that of GaP substrate 6, that is, a=5.449A is formed by epitaxial growth. On the n-type $Cu(Al_{0.60}Ga_{0.40})(Se_{0.46}S_{0.54})$ layer 7, a p-type $Cu(Al_{0.60}Ga_{0.40})(Se_{0.46}S_{0.54})$ layer 8, which is a chalcopyrite semiconductor, having a substantially identical value of lattice constant to that of GaP substrate 6, that is, a=5.449A is formed by epitaxial growth. On the p-type $Cu(Al_{0.60}Ga_{0.40})(Se_{0.46}S_{0.54})$ layer 8, the In-Ga electrode 4 is formed as a p-type electrode on the opposite side of the n-type $Cu(Al_{0.60}Ga_{0.40})(Se_{0.46}S_{0.54})$ layer 7. On the GaP substrate 6, an Au-Si electrode 9 is formed on the opposite side of the n-type layer $(Al_{0.60}Ga_{0.40})(Se_{0.46}S_{0.54})$ 7.

Forbidden energy gaps of these n-type and p-type layers of the second embodiment are approximately 2.70 eV.

This LED is formed by the MBE method as similar to the first embodiment. That is, the n-type GaP substrate 6 is heated to about 400° C. Then, the n-type $Cu(Al_{0.60}Ga_{0.40})(Se_{0.46}S_{0.54})$ 7 is formed by epitaxial growth at 400° C. to have a thickness of about 1 μm. During this processing, Zn is doped. Then, in the same growth condition, the $Cu(Al_{0.60}Ga_{0.40})(Se_{0.46}S_{0.54})$ layer 8 is formed by epitaxial growth to have a thickness of about 1 μm. During this processing, As is doped into the $Cu(Al_{0.60}Ga_{0.40})(Se_{0.46}S_{0.54})$ layer 8 to have p-type characteristic.

It has been found that when a current is passed through this LED having the above configuration of the second embodiment to estimate a current to voltage characteristic, this LED emits blue light of 100 mcd stable at wavelength of 460 nm when the forward current is 20 mA.

Figure 3:
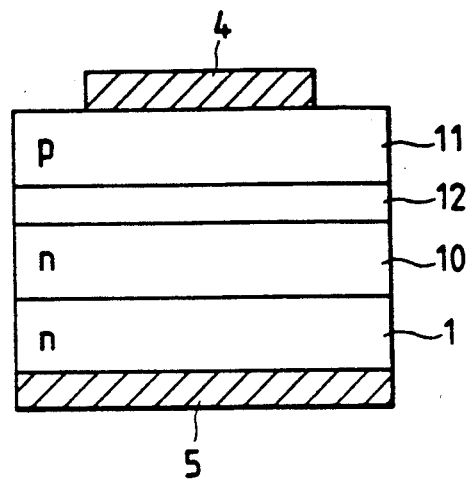
FIG. 3 is a cross-sectional view of the third embodiment of the present invention.

Hereinbelow will be described a third embodiment of this invention. FIG. 3 is a cross-sectional view of the third embodiment of the present invention, which is a semiconductor laser as a semiconductor light-emitting device. In FIG. 3, on the n-type GaAs substrate 1, a double-heterostructure is provided with lattice matching. The double-heterostructure comprises: a $(Zn_{0.66}Cd_{0.34})(Se_{0.5}S_{0.5})$ active layer 12; an n-type $(Cu_{0.27}Ag_{0.73})(Al_{0.4}Ga_{0.6})S_2$ layer 10, which is a chalcopyrite semiconductor; and a p-type $(Cu_{0.27}Ag_{0.73})(Al_{0.4}Ga_{0.6})S_2$ layer 11, one of chalcopyrite semiconductors. The $(Zn_{0.66}Cd_{0.34})(Se_{0.5}S_{0.5})$ active layer 12 is sandwiched between the n-type $(Cu_{0.27}Ag_{0.73})(Al_{0.4}Ga_{0.6})S_2$ layer 10 and the p-type $(Cu_{0.27}Ag_{0.73})(Al_{0.4}Ga_{0.6})S_2$ layer 11. Forbidden energy gaps of these n-type and p-type layers are approximately 3.1 eV.

In the first and second embodiments, dopant levels of N, P, and As are $1\times10^{18}$ cm$^{-3}$. Among these dopants, As is most easily to be treated. Moreover, dopant levels of Zn, Cd, Cl, Br, and I are $1\times10^{18}$ cm$^{-3}$, $1\times10^{17}$ cm$^{-3}$, $1\times10^{18}$ cm$^{-3}$, $1\times10^{17}$ cm$^{-3}$, and $1\times10^{17}$ cm$^{-3}$ respectively. Among these dopants, Zn and Cl are preferable and the LED doped with either or both these elements emits light brightest.

This semiconductor laser of the third embodiment is formed by the MBE method as similar to the first embodiment. That is, on the n-type GaAs substrate 1, the Zn-doped n-type $(Cu_{0.27}Ag_{0.73})(Al_{0.4}Ga_{0.6})S_2$ layer 10 is formed with Zn-doping by epitaxial growth at 400° C. to have a thickness of 1 μm. Then, the $(Zn_{0.66}Cd_{0.34})(Se_{0.5}S_{0.5})$ active layer 12 is formed by epitaxial growth at 300° C. to have a thickness of about 0.12 μm. Then, the p-type $(Cu_{0.27}Ag_{0.73})(Al_{0.4}Ga_{0.6})S_2$ layer 11 is formed with As-doping to have a thickness of about 1 μm by epitaxial growth at 400° C.

It has been found that when a current is passed through this light-emitting device having the above configuration to estimate a current to light output characteristic, this semiconductor laser emits blue light of 5 mW stable at wavelength of 430 nm when the forward current is 80 mA.

Figure 4:
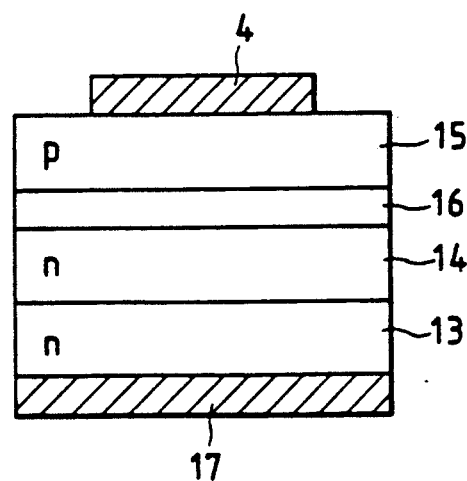
FIG. 4 is a cross-sectional view of the fourth embodiment of the present invention.

Hereinbelow will be described a fourth embodiment of this invention. FIG. 4 is a cross-sectional view of the fourth embodiment of the present invention, which is a semiconductor laser as a semiconductor light-emitting device. In FIG. 4, on an n-type InP substrate 13, a double-heterostructure is provided with lattice matching. The double-heterostructure comprises: a $Zn(Se_{0.55}Te_{0.45})$ active layer 16; an n-type $(Cu_{0.32}Ag_{0.68})(Al_{0.9}Ga_{0.1})Se_2$ layer 14, which is a chalcopyrite semiconductor; and a p-type $(Cu_{0.32}Ag_{0.68})(Al_{0.9}Ga_{0.1})Se_2$ layer 15, which is a chalcopyrite semiconductor. The $Zn(Se_{0.55}Te_{0.45})$ active layer 16 is sandwiched between the n-type $(Cu_{0.32}Ag_{0.68})(Al_{0.9}Ga_{0.1})Se_2$ layer 14 and the p-type $(Cu_{0.32}Ag_{0.68})(Al_{0.9}Ga_{0.1})Se_2$ layer 15. In FIG. 4, numeral 17 is an Au-Sn electrode as n-type electrode.

Forbidden energy gaps of these n-type and p-type layers except the active layer 16 are approximately 2.7 eV. A forbidden energy gap of the active layer 16 is about 2.5 eV.

This Semiconductor laser of the fourth embodiment is formed by the MBE method as similar to the first embodiment. That is, on the n-type InP substrate 13, the $(Cu_{0.32}Ag_{0.68})(Al_{0.9}Ga_{0.1})Se_2$ layer 14 is formed with Zn-doping by epitaxial growth at 400° C. to have a thickness of 1 μm. Then, the $Zn(Se_{0.55}Te_{0.45})$ active layer 16 is formed by epitaxial growth at 300° C. to have a thickness of about 0.12 μm. Then, the $(Cu_{0.32}Ag_{0.68})(Al_{0.9}Ga_{0.1})Se_2$ layer 15 is formed with As-doping to have a thickness of about 1 μm by epitaxial growth at 400° C.

It has been found that when a current is allow to flow through this light-emitting device having the above configuration in order to estimate a current to light output characteristic, this semiconductor laser emits blue light of 5 mW stable at wavelength of 500 nm when the forward current is 80 mA.

In the third and fourth embodiments, assuming the active layer 12 or 16 consists essentially of $(Zn_dCd_{1-d})(Se_mS_nTe_{1-m-n})$, wherein $0 \leq d \leq 1, 0 \leq m \leq 1, 0 \leq n \leq 1$, and $m+n \leq 1$, the preferred range of $m+n$ is given by:

$$0.2 \leq m+n \leq 1.$$

This results from the possible range for lattice matching of the active layer 12 or active layer 16 with chalcopyrite type compound semiconductor. However, this is not absolute condition but only preferably condition.

In the embodiments mentioned above, As is used as a p-type dopant and Zn is used as an n-type dopant. However, the same production method is applicable when N, P, or Sb is used as a p-type dopant and Cd, Cl, Br, or I is used as an n-type dopant. In that case, a plurality of dopants can be used at the same time.

Moreover, in the embodiments mentioned above, since n-type substrates are used, the semiconductor layers extend from the substrate successively in the sequence n-type layer, active layer, p-type layer. However if a p-type substrate were to be used, of course the layers of the device would be successively arranged extending from the substrate in the sequence p-type layer, active layer, and n-type layer.

Figure 5:
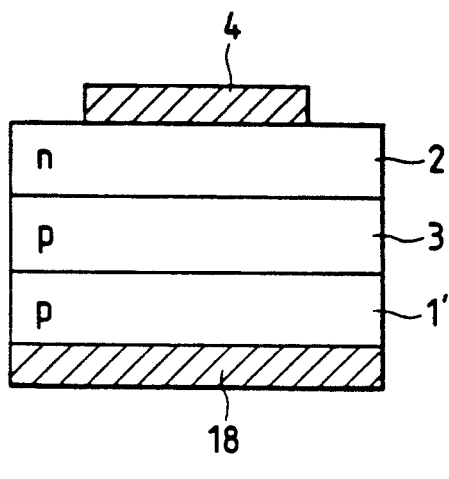
FIG. 5 is a cross-sectional view of a first modified embodiment.
Figure 7:
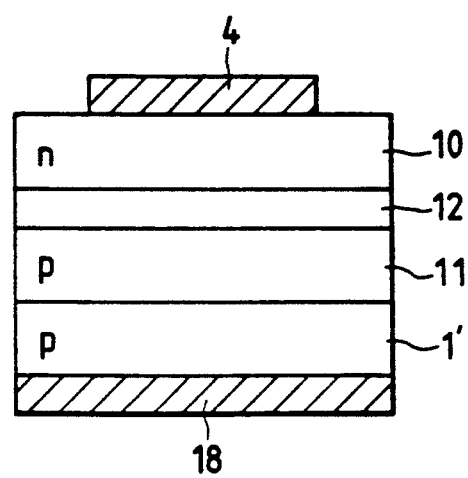
FIG. 7 is a cross-sectional view of a third modified embodiment.
Figure 6:
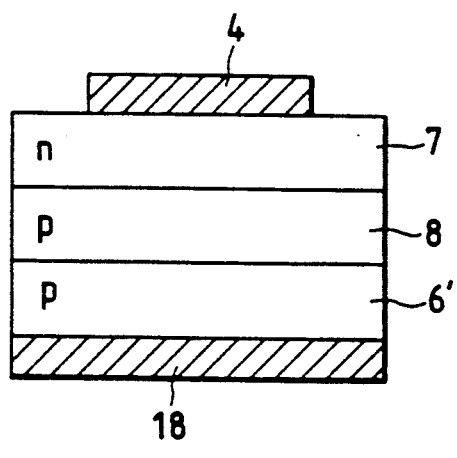
FIG. 6 is a cross-sectional view of a second modified embodiment.
Figure 8:
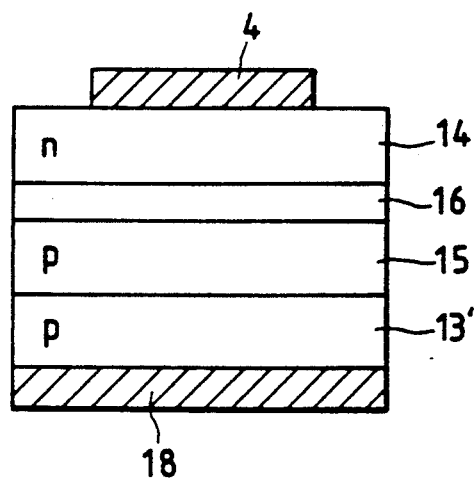
FIG. 8 is a cross-sectional view of a fourth modified embodiment.

For example, such modified embodiment is shown in FIGS. 5 to 9. FIG. 5 is a cross-sectional view of a first modified embodiment showing an LED which corresponds to the first embodiment. Numeral 1' is a p-type GaAs substrate. The p-type $(Cu_{0.89}Ag_{0.11})AlSe_2$ layer 3 is formed on the p-type substrate 1'. The n-type layer $(Cu_{0.89}Ag_{0.11})AlSe_2$ 2 is formed on the p-type $(Cu_{0.89}Ag_{0.11})AlSe_2$ layer 3. The Au-Zn electrode 18 is formed on the p-type substrate 1'. The In-Ga electrode 4 is formed on the n-type $(Cu_{0.89}Ag_{0.11})AlSe_2$ layer 2. FIG. 6 is a cross-sectional view of a second modified embodiment which corresponds to the second embodiment. FIG. 7 is a cross-sectional view of a third modified embodiment which corresponds to the third embodiment. FIG. 8 is a cross-sectional view of a fourth modified embodiment which corresponds to the fourth embodiment. These second to fourth modified embodiments are effected on the basis of the similar technique to the modified embodiment shown in FIG. 5. Therefore, a detailed descriptions are omitted.

Moreover, in this invention, it would also be possible to form such a device having a buffer layer or to form such a device in a stripe pattern, to achieve current concentration (i.e. to form the electrodes as stripes, or the semiconductor layers). Further, various modifications can be considered without deviation from the subject matter of this invention.

It can be understood from the above that the present invention enables semiconductor light-emitting devices to be manufactured which provide emission wavelengths corresponding to the blue to ultra-violet region of the spectrum, which has not hitherto been possible. The main reason for this fact is considered that this invention enables p-type and n-type conduction control with good-property films obtained by formation of chalcopyrite compound semiconductor by the epitaxial growth on a high quality substrate such as GaAs, GaP, or InP. Therefore, this invention can increase the number of colors which can be used in display applications and improve performance of the optical disc or laser printer applications.

What is claimed is:

1. A semiconductor light-emitting device comprising a substrate and an p-n junction structure formed on said substrate, said p-n junction structure having first and second semiconductor layers, each consisting essentially of $(Cu_aAg_{1-a})(Al_bGa_{1-b})(Se_cS_{1-c})_2$, wherein $0 \leq a \leq 1, 0 \leq b \leq 1,$ and $0 \leq c \leq 1$, said first semiconductor layer being doped with one or more elements selected from a first group consisting of N, P, and As to be of a p-type, said second semiconductor layer being doped with one or more elements selected from a second group consisting of Zn, Cd, Cl, Br, and I to be of an n-type.

2. A semiconductor light-emitting device as claimed in claim 1, wherein said substrate is in lattice matching with said p-n junction structure.

3. A semiconductor light-emitting device as claimed in claim 1, wherein said substrate is of an n-type and said second semiconductor layer and said first semiconductor layer are formed on said substrate in this order.

4. A semiconductor light-emitting device as claimed in claim 1, wherein said substrate is of a p-type and said first semiconductor layer and said second semiconductor layer are formed on said substrate in this order.

5. A semiconductor light-emitting device as claimed in claim 1, wherein said one element doped into said first semiconductor is N.

6. A semiconductor light-emitting device as claimed in claim 1, wherein said one element doped into said first semiconductor is P.

7. A semiconductor light-emitting device as claimed in claim 1, wherein said one element doped into said first semiconductor is As.

8. A semiconductor light-emitting device as claimed in claim 1, wherein said one element doped into said second semiconductor is Zn.

9. A semiconductor light-emitting device as claimed in claim 1, wherein said said one element doped into said second semiconductor is Cd.

10. A semiconductor light-emitting device as claimed in claim 1, wherein said said one element doped into said second semiconductor is Cl.

11. A semiconductor light-emitting device as claimed in claim 1, wherein said said one element doped into said second semiconductor is Br.

12. A semiconductor light-emitting device as claimed in claim 1, wherein said said one element doped into said second semiconductor is I.

13. A semiconductor light-emitting device comprising a substrate and a double-heterostructure formed on said substrate, said double-heterostructure having: a p-type semiconductor layer, an n-type semiconductor layer, and an active layer sandwiched between said p-type semiconductor layer and said n-type semiconductor layer, each of said p-type semiconductor layer and n-type semiconductor layer consisting essentially of $(Cu_aAg_{1-a})(Al_bGa_{1-b})(Se_cS_{1-c})_2$, wherein $0 \leq a \leq 1$, $0 \leq b \leq 1$, and $0 \leq c \leq 1$, said active layer consisting essentially of $(Zn_dCd_{1-d})(Se_mS_nTe_{1-m-n})$, wherein $0 \leq d \leq 1$, $0 \leq m \leq 1$, $0 \leq n \leq 1$, and $m+n \leq 1$.

14. A semiconductor light-emitting device as claimed in claim 13, wherein said substrate is in lattice matching with said double-heterostructure.

15. A semiconductor light-emitting device as claimed in claim 13, wherein said substrate is of an n-type and said n-type semiconductor layer, said active layer, and said p-type semiconductor layer are formed on said substrate in this order.

16. A semiconductor light-emitting device as claimed in claim 13, wherein said substrate is of a p-type and said p-type semiconductor layer, said active layer, and said n-type semiconductor layer are formed on said substrate in this order.

17. A semiconductor light-emitting device as claimed in claim 13, wherein said p-type semiconductor layer is made p-type by doping with As.

18. A semiconductor light-emitting device as claimed in claim 13, wherein said n-type semiconductor layer is made p-type by doping with Zn.

19. A semiconductor light-emitting device as claimed in claim 13, wherein $0.2 \leq$ said $m+n \leq 1.0$.

* * * * *